United States Patent [19]

Lund et al.

[11] Patent Number: 4,782,373

[45] Date of Patent: Nov. 1, 1988

[54] SELF-ALIGNED SEMICONDUCTOR DEVICE WITH NON-DIFFUSABLE CONTACTS

[75] Inventors: Clarence A. Lund; Jenny M. Ford, both of Phoenix, Ariz.

[73] Assignee: Motorola Inc., Schaumburg, Ill.

[21] Appl. No.: 101,694

[22] Filed: Sep. 25, 1987

[51] Int. Cl.[4] .......................................... H01L 29/78
[52] U.S. Cl. .................... 357/23.9; 357/41; 357/51; 357/59
[58] Field of Search ............... 357/23.9, 41, 51, 59 F, 357/59 J

[56] References Cited

U.S. PATENT DOCUMENTS 4,240,097 12/1980 Raymond ........................ 357/23.9
4,453,175 6/1984 Ariizumi ......................... 357/23.9

Primary Examiner—Andrew J. James
Assistant Examiner—Mark Prenty
Attorney, Agent, or Firm—Harry A. Wolin

[57] ABSTRACT

An active portion of a cell of a static RAM semiconductor device comprising a MOSFET and a variable resistor load device having non-diffused contacts which are self-aligned is described. A polycrystalline gate is used as a mask for the implantation of a source and a drain into a semiconductor substrate. Following the formation of a conformal dielectric layer and a conformal polycrystalline layer PtSi contacts are formed. These contacts are also aligned by the gate and do not diffuse and therefore may be spaced closely together. As the MOSFET of the device is turned "on" and "off" the resistance of the load device increases and decreases proportionately.

8 Claims, 1 Drawing Sheet

SELF-ALIGNED SEMICONDUCTOR DEVICE WITH NON-DIFFUSABLE CONTACTS

BACKGROUND OF THE INVENTION

This invention generally pertains to a portion of a cell of a static RAM semiconductor device comprising a MOSFET and a variable resistor load device having self-aligned, non-diffused contacts. Generally, in semiconductor devices which store data statically, it is desirable to have a load structure which can be turned "off", thereby minimizing the current passing through the device and the power drawn by the circuit. This has been done previously using transistors as the load device, however, this uses a relatively large amount of space. Therefore, a resistor load device having a high resistor value and utilizing a relatively low amount of space is highly desirable.

Resistor loads for semiconductor devices of this type are commonly fabricated using diffusion technology. With diffusion technology, there is always a certain amount of unwanted diffusion of dopants between the crystals in a polysilicon material which limits the minimum spacing achievable between adjacent contacts. Because of this unwanted diffusion, the contacts must be spaced relatively far apart to maintain the required resistance in the load device. However, if contacts which would not diffuse into polysilicon material were employed, the spacing between contacts may be reduced thereby allowing for a smaller semiconductor device.

SUMMARY OF THE INVENTION

The present invention pertains to an active portion of a cell of a static RAM semiconductor device comprising a MOSFET and a variable resistor load device having non-diffused contacts which are self-aligned. After providing a semiconductor substrate and isolating a device area thereon, a gate oxide layer is grown on the substrate. Next, a gate polysilicon layer is formed on the gate oxide layer and patterned into a gate. The gate is then used as a mask in a self-aligned implant of a source and a drain into the substrate. These steps create the MOSFET portion of the device.

Once the source and drain are implanted, a conformal oxide layer is deposited thereon and followed by the deposition of a conformal polysilicon layer. After implanting the conformal polysilicon layer, a conformal Pt or PtSi layer is sputtered thereon. This layer is then etched back to form non-diffused contacts, for the semiconductor device. The non-diffused contacts, like the source and drain, are aligned by the gate and therefore, an additional masking step is not required. By non-diffused, it is meant that the material comprising the contacts does not diffuse appreciably into the conformal polysilicon layer between the contacts and therefore allows the device to maintain a high resistivity and close spacing of contacts. In the active semiconductor device of the present invention, as the MOSFET is turned "on" and "off", the load resistivity increases and decreases proportionately. The resultant semiconductor device uses a stacked configuration which requires a relatively small amount of space.

It is an object of the present invention to provide a new and improved portion of a cell of a static RAM semiconductor device comprising a MOSFET and a variable resistor load device wherein as the MOSFET is turned "on" and "off", the resistance in the resistor increases and decreases respectively.

It is a further an object of the present invention to provide a new and improved portion of a cell of a static RAM semiconductor device which utilizes self-aligned contacts.

It is a further object of the present invention to provide a new and improved portion of a cell of a static RAM semiconductor device having non-diffused contacts.

It is a further object of the present invention to provide a new and improved portion of a cell of a static RAM semiconductor device which maintains a high resistivity while allowing contacts to remain relatively close together.

It is a further object of the present invention to provide a new and improved portion of a cell of a static RAM semiconductor device which requires a relatively small amount of power to operate.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
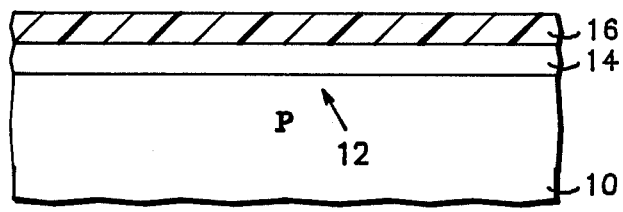
FIGS. 1-5 are highly enlarged cross-sectional views of a portion of a cell of a static RAM semiconductor device during various stages of processing.
Figure 2:
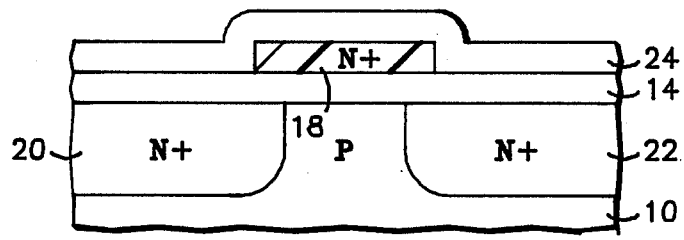

Referring specifically to FIGS. 1 and 2, highly enlarged cross-sectional views of a portion of a cell of a static RAM semiconductor device are shown during various stages of processing. Initially, a semiconductor substrate, 10, is provided and a device area, 12, is isolated thereon. In this embodiment, semiconductor substrate 10 is single crystal silicon substrate having a P conductivity type, however, it should be understood that there are many types of semiconductor substrates which may be employed. Device area 12 is isolated on semiconductor substrate 10 by methods well known in the art such as locos or trench isolation technology (not shown). Next, a gate dielectric layer, 14, is formed on semiconductor substrate 10. In this embodiment, gate dielectric layer 14 is a silicon-oxide which is grown on semiconductor substrate 10 but other methods and dielectric materials for layer 10 may also be used. A polycrystalline gate layer, 16, is now formed on gate dielectric layer 14. In this embodiment, polycrystalline gate layer 16 is a polysilicon layer which is deposited or grown. Techniques for depositing polycrystalline semiconductor layers are well known in the art.

Following the deposition of gate layer 16, a gate, 18, is formed from polycrystalline gate layer 16 by methods of patterning and etching which are well known in the art. Once gate 18 has been formed, a source, 20, and a drain, 22, are formed in semiconductor substrate 10. Source 20 and drain 22 are implanted using gate 18 as a mask for a self-aligned implant. In the present example, source 20, drain 22, and gate 18 are all doped with an N+ conductivity type. Next, a conformal dielectric layer, 24, is formed on gate 18 and gate dielectric layer 14. Conformal dielectric layer 24 is conveniently of silicon-oxide although other dielectric materials may also be used. FIG. 2 essentially shows a MOSFET which is a portion of the present device.

Figure 3:
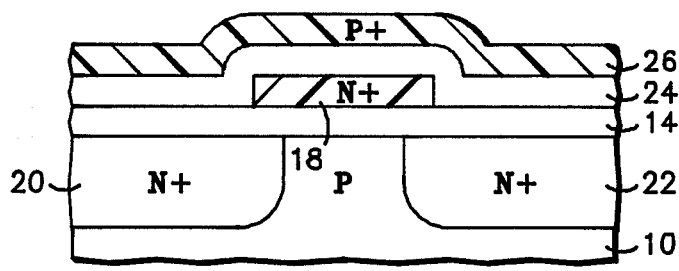
Figure 4:
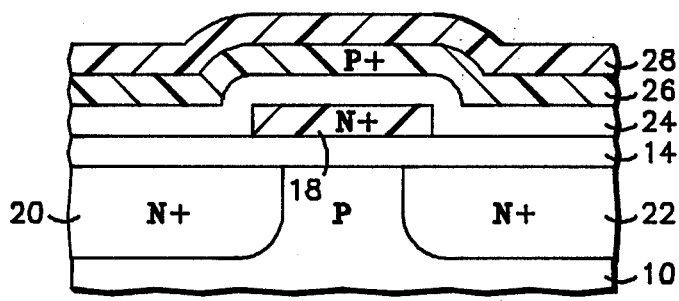
Figure 5:
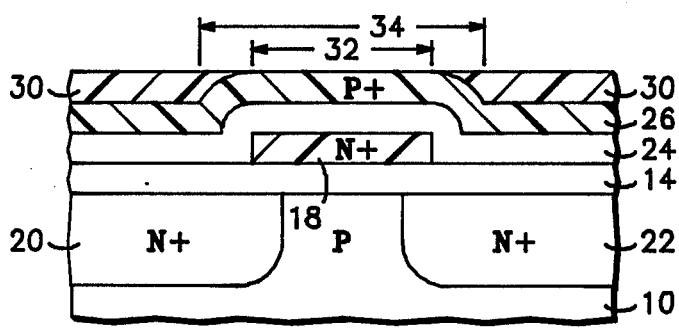

Referring specifically to FIGS. 3-5, highly enlarged cross-sectional views of a portion of a cell of a static RAM semiconductor device are shown during various stages of processing. Following the formation of conformal dielectric layer 24, a conformal polycrystalline layer, 26, is formed thereon. In this example, conformal polycrystalline layer 26 is a polysilicon layer which is deposited. Other materials and methods may also be used. Conformal polycrystalline layer 26 may be doped either during or following formation. In this example, conformal polycrystalline layer 26 is of a lightly doped P+ conductivity type.

After the formation of conformal polycrystalline layer 26, a PtSi contact layer, 28, is formed thereon. The PtSi is conveniently formed by depositing Pt on polysilicon and heating to react, or by depositing PtSi directly. Sputtering and evaporation are well known deposition techniques although others may also be used. PtSi is chosen as a contact material in laye 28 because it does not readily diffuse in polycrystalline silicon. However, other conductors which do not readily diffuse in the material of layer 26 may also be used for layer 28. PtSi contact layer 28 is then etched in a predetermined manner, so that at least two spaced-apart PtSi contacts, 30, are formed (see FIG. 5). PtSi contacts 30 are aligned using gate 18 and therefore, no additional mask steps are required to form PtSi contacts 30. Conformal polycrystalline layer 26 and contacts 30 essentially form a variable resistor load device which is disposed on the previously processed MOSFET.

The non-diffused contacts of the present invention allow for a relatively small distance between contacts 30 while allowing the portions of layer 26 between contacts 30 to maintain a relatively high resistor value. In the present invention, thecontact length distance, 34, is approximately 0.8 micrometers while the gate length distance, 32, is approximately 0.5 micrometers. It should be understood that both gate length distance 32 and contact length distance 34 may be larger or smaller than the described embodiment.

The semiconductor device of the present invention operates in an active manner. This means that the resistance of the variable resistor load device is dependent on a switching potential, namely gate 18 of the underlying MOSFET. As the MOSFET of the present invention is turned "on" and "off", the resistance of the variable resistor load device proportionally increases and decreases respectively. Additionally, the stacked arrangement of the semiconductor device which allows for a relatively small gate length distance 32 along with non-diffused. PtSi contacts 30 which may be formed relatively close together, allow for a relatively small static RAM semiconductor device which maintains a relatively high resistance load. This device is known as a Jenram.

Thus it is apparent that there has been provided, in accordance with the invention, a new and improved static RAM semiconductor device and method for its fabrication which meet the objects and advantages set forth above. While specific embodiments of this invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

I claim:

1. An active semiconductor device comprising a MOSFET and a variable resistor load device comprising:

a semiconductor substrate;

a source and a drain disposed in said substrate;

a gate dielectric layer disposed on said substrate;

a polycrystalline gate disposed on said gate dielectric layer;

a conformal dielectric layer disposed on said gate;

a conformal polycrystalline layer disposed on said conformal dielectric layer; and at least two spaced-apart non-diffused contacts disposed on portions of said conformal polycrystalline layer, said contacts being aligned on said conformal polycrystalline layer by said gate.

2. The device of claim 1 wherein the non-diffusable contacts comprise a metal.

3. The device of claim 2 wherein the non-diffusable contacts comprise a silicide.

4. The device of claim 3 wherein the non-diffusable contacts comprise PtSi.

5. The device of claim 1 wherein the polycrystalline gate has a length in the range of 0.1 to 1.0 micrometers.

6. The device of claim 5 wherein the polycrystalline gate has a length of approximately 0.5 micrometers.

7. The device of claim 1 wherein the conformal polycrystalline layer has a length in the range of 0.4 to 1.6 micrometers between the non-diffused contacts.

8. The device of claim 7 wherein the conformal polycrystalline layer has a length of approximately 0.8 micrometers between the non-diffused contacts.

* * * * *